(12) United States Patent
Braun (10) Patent No.: US 7,088,611 B2
(45) Date of Patent: Aug. 8, 2006

(54) MRAM WITH SWITCHABLE FERROMAGNETIC OFFSET LAYER

(75) Inventor: Daniel Braun, Paris (FR)

(73) Assignees: Infineon Technologies AG, Munich (DE); Altis Semiconductor, Cedex (FR)

( * ) Notice: Subject to any disclaimer, the term of this patent is extended or adjusted under 35 U.S.C. 154(b) by 0 days.

(21) Appl. No.: 10/998,807

(22) Filed: Nov. 30, 2004

(65) Prior Publication Data

US 2006/0114712 A1   Jun. 1, 2006

(51) Int. Cl.
*G11C 11/14* (2006.01)
(52) U.S. Cl. ............... 365/171; 365/158; 365/173
(58) Field of Classification Search ............... 365/171, 365/173, 158
See application file for complete search history.

(56) References Cited

U.S. PATENT DOCUMENTS

| | | | |
|---|---|---|---|
| 6,072,718 A * | 6/2000 | Abraham et al. ........... 365/173 |
| 6,531,723 B1 | 3/2003 | Engel et al. |
| 6,545,906 B1 | 4/2003 | Savtchenko et al. |
| 6,865,109 B1 * | 3/2005 | Covington ................. 365/173 |
| 6,958,927 B1 * | 10/2005 | Nguyen et al. ............ 365/158 |

* cited by examiner

*Primary Examiner*—Tuan T. Nguyen
(74) *Attorney, Agent, or Firm*—Edell, Shapiro & Finnan LLC (57) ABSTRACT

A magnetoresistive memory cell includes a magnetic tunnel junction including first (fixed) and second (free) magnetic regions, where the second magnetic region includes at least two ferromagnetic layers being antiferromagnetically coupled. The magnetoresistive memory cell further includes a switchable ferromagnetic offset field layer being provided with a free magnetic moment vector that is freely switchable between the same and opposite directions with respect to the fixed magnetic moment vector of the first magnetic region. A method of switching a magnetoresistive memory cell includes adiabatic rotational switching, where the memory cell is brought in an active state exhibiting reduced switching fields before its switching and is brought in a passive state exhibiting enlarged switching fields after its switching.

19 Claims, 4 Drawing Sheets

MRAM WITH SWITCHABLE FERROMAGNETIC OFFSET LAYER

FIELD OF THE INVENTION

The present invention relates to non-volatile semiconductor memory chips and more particularly is concerned with magnetoresistive memory cells for use in a semiconductor integrated circuit.

BACKGROUND

Magnetic (or magnetoresistive) random access memory (MRAM) is a non-volatile access memory technology that could potentially replace the dynamic random access memory (DRAM) as the standard memory for computing devices. Particularly, the use of MRAM-devices as a non-volatile RAM will eventually allow for "instant on"-systems that come to life as soon as the computer system is turned on, thus saving the amount of time needed for a conventional computer to transfer boot data from a hard disk drive to volatile DRAM during system power up.

A magnetic memory cell (also referred to as a tunneling magneto-resistive or TMR-device) includes a structure having ferromagnetic layers respectively provided with a resultant magnetic moment vector and separated by a non-magnetic layer (tunnel barrier) and arranged into a magnetic tunnel junction (MTJ). Digital information is stored and represented in the magnetic memory cell as directions of magnetic moment vectors in the ferromagnetic layers. More specifically, the resultant magnetic moment vector of one ferromagnetic layer is magnetically fixed or pinned (conveniently also referred to as "reference layer" or "pinned layer"), while the resultant magnetic moment vector of the other ferromagnetic layer (conveniently also referred to as "free layer") is free to be switched between two preferred directions, i.e. the same and opposite directions with respect to the fixed magnetization direction of the reference layer. The orientations of the magnetic moment vector of the free layer are also known as "parallel" and "antiparallel" states, respectively, wherein a parallel state refers to the same magnetic alignment of the free and reference layers, while an antiparallel state refers to opposing magnetic alignments therebetween. Accordingly, a memory state of a magnetic memory cell is not maintained by power as in DRAMs, but rather by the direction of the magnetic moment vector of the free layer with respect to the direction of the magnetic moment vector of the reference layer.

Depending upon the magnetic states of the free layer (i.e. parallel or antiparallel states), the magnetic memory cell exhibits two different resistance values in response to a voltage applied across the magnetic tunnel junction barrier. The particular resistance of the TMR-device thus reflects the magnetization state of the free layer, wherein the resistance is "low" when the magnetization is parallel, and "high" when the magnetization is antiparallel. Accordingly, a detection of changes in resistance allows an MRAM-device to provide information stored in the magnetic memory element, that is to say to read information from the magnetic memory cell. In addition, a magnetic memory cell is written to through the application of bi- or uni-directional currents in order to magnetically align the free layer in a parallel or an antiparallel state.

An MRAM-chip typically integrates a plurality of magnetic memory cells and other circuits, such as a control circuit for magnetic memory cells, comparators for detecting states in a magnetic memory cell, input/output circuits and miscellaneous support circuitry. Conveniently, magnetic memory cells are designed to be integrated into the back end wiring structure of back-end-of-line (BEOL) CMOS processing following front-end-of-line (FEOL) CMOS processing.

To be useful in present day electronic devices, very high density arrays of magnetic memory cells are utilized in magnetic random access memory devices. In these high density arrays the magnetic cells are generally arranged in rows and columns, with individual cells being addressable for reading and writing operations by the selection of an appropriate row and column containing the desired cell. Also, conveniently orthogonal current lines are provided, one for each row and one for each column so that a selected cell is written by applying current to the appropriate row current line and the appropriate column current line.

In such a typical tri-layer arrangement of MRAM-cells, if a magnetic field having at least a vector component in the direction opposite to the magnetization direction of the free layer is applied in the direction of the easy axis (preferred direction or direction of magnetic anisotropy), then the magnetic moment vector of the free layer is reversed at a critical magnetic field value, which is also referred to as reversal magnetic field. The value of the reversal magnetic field can be determined from a minimum energy condition. Assuming that a magnetic field applied to the direction of the hard axis of magnetization is represented by $H_x$ and a magnetic field applied to the direction of the easy axis of magnetization is represented by $H_y$, then a relationship $H_x^{(2/3)} + H_y^{(2/3)} = H_c^{(2/3)}$ is established, where $H_c$ represents the anisotropic magnetic field of the free layer. Since this curve forms an astroid on the $H_x$-$H_y$-plane, it is called an astroid curve. As can be seen from the above relationship, a composite magnetic field enables the selection of a single MRAM-cell in the case where the sum of both magnetic fields at least amounts to the reversal magnetic field. Based on the above equation, a typical switching mechanism used for switching MRAM-cells is the "Stoner-Wohlfahrt"-switching scenario, well-known to those skilled in the art, in which the magnetic anisotropy of the free layer is chosen to be approximately parallel to the wafer surface.

In recent years, a new concept of magnetoresistive tunneling junction memory cells has been proposed, where the free layer is designed to be a free magnetic region including a number of ferromagnetic layers that are antiferromagnetically coupled. The number of antiferromagnetically coupled ferromagnetic layers may be appropriately chosen to increase the effective magnetic switching volume of the MRAM device. See, for instance, U.S. Pat. No. 6,531,723 to Engel et al., the disclosure of which is incorporated herein by reference in its entirety.

For switching of such magnetoresistive memory cells having a free magnetic region including antiferromagnetically coupled ferromagnetic layers, another switching scenario, the so-called "adiabatic rotational switching", which is well-known to those skilled in the art, is envisaged. The adiabatic rotational switching mechanism is, for example, disclosed in U.S. Pat. No. 6,545,906 to Savtchenko et al., the disclosure of which is incorporated herein by reference in its entirety.

One major difference between convenient Stoner-Wohlfarth-switching and adiabatic rotational switching is given by the fact that the latter one typically uses only uni-directional currents applied to bit and word lines for switching of the resultant magnetic moment vector of the free magnetic region. More specifically, adiabatic rotational switching relies on the "spin-flop" phenomenon, which lowers the total magnetic energy in an applied magnetic field by rotating the magnetic moment vectors of the magnetic free region ferromagnetic layers.

Figure 1:
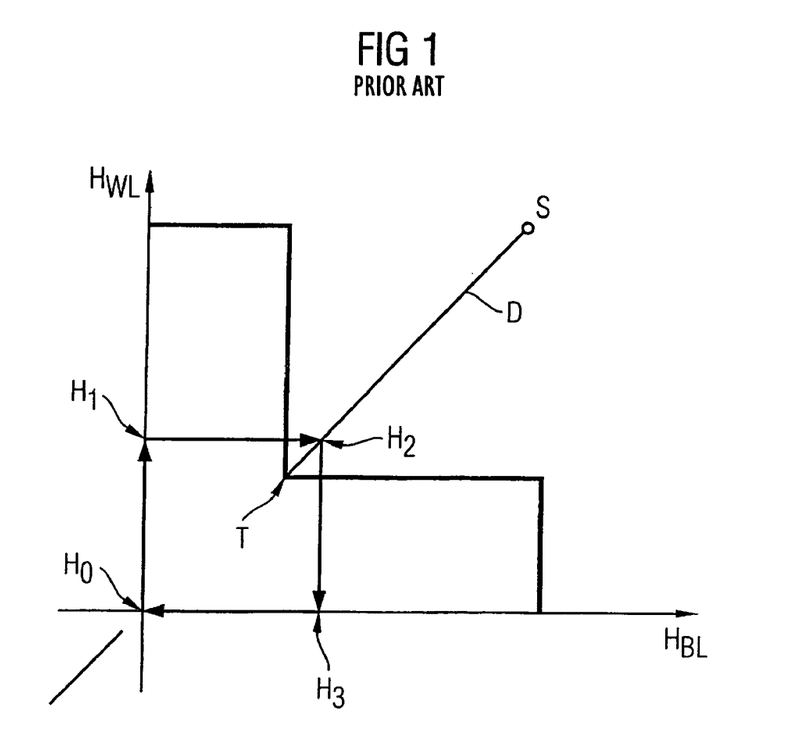
FIG. 1 depicts an exemplary typical stability diagram of a memory cell comprising a free magnetic region including antiferromagnetically coupled ferromagnetic layers, in which toggle switching is illustrated.

Now reference is made to FIG. 1, where a typical stability diagram for an adiabatic rotation switchable MRAM cell is illustrated, the abscissa of which represents the bit line magnetic field $H_{BL}$, while its ordinate represents the word line magnetic field $H_{WL}$, which respectively arrive at the MRAM cell for its switching. Using the spin-flop phenomenon in an MRAM cell having antiferromagnetically coupled magnetic moment vectors $M_1$ and $M_2$ exhibited by the free magnetic region ferromagnetic layers inclined at a 45° angle to the word and bit lines, respectively, a timed switching pulse sequence of applied magnetic fields in a typical "toggling write" mode is at follows: at a time $t_0$ neither a word line current nor a bit line current are applied resulting in a zero magnetic field $H_0$ of both $H_{BL}$ and $H_{WL}$. At a time t1, the word line current is increased to $H_1$ and magnetic moment vectors $M_1$ and $M_2$ begin to rotate either clockwise or counter-clockwise, depending on the direction of the word line current, to align themselves nominally orthogonal to the field direction. At a time $t_2$, the bit line current is switched on. The bit line current is chosen to flow in a certain direction so that both magnetic moment vectors $M_1$ and $M_2$ are further rotated in the same clockwise or counter-clockwise direction as the rotation caused by the word line magnetic field. At this time $t_2$, both the word and bit line currents are on, resulting in magnetic field $H_2$ with magnetic moment vectors $M_1$ and $M_2$ being nominally orthogonal to the net magnetic field direction, which is 45° with respect to the current lines. At a time $t_3$, the word line current is switched off, resulting in magnetic field $H_3$, so that magnetic moment vectors $M_1$ and $M_2$ are being rotated only by the bit line magnetic field. At this point in time, magnetic moment vectors $M_1$ and $M_2$ have generally been rotated past their hard axis instability points. Finally, at a time $t_4$, the bit line current is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the MRAM cell has been switched from its parallel state into its anti-parallel state, or vice versa, depending on the state switching ("toggling") starts off with.

In order to successfully switch the MRAM cell, it is essential that the magnetic field sequence applied thereon results in a magnetic field path crossing a diagonal line and circling around a critical magnetic field value ("toggling point") T for initiating toggle switching, since only in that case magnetic moment vectors $M_1$ and $M_2$ are rotated past their hard axis instability points.

Otherwise, magnetic fields applied on the MRAM cells must not arrive at another critical magnetic field value ("saturation point") S illustrated in FIG. 1, at which both magnetic moment vectors $M_1$ and $M_2$ of antiferromagnetically coupled ferromagnetic layers of the free magnetic region are forced to align with the applied external magnetic field(s) in a parallel configuration.

The cut in the first quadrant in FIG. 1 leads to rectangular "astroids" with a large switching margin. In principle, the toggle field and the activation energy can be adjusted independently in this concept.

However, there are several problems to be tackled in scaling down above MRAM cells, which is one of the most important issues for low-cost and high-density MRAM devices, especially in light of modern portable equipment, such as portable computers, digital still cameras and the like.

Down-scaling such MRAM cells requires smaller and smaller magnetic tunnel junctions, which is problematic, since for a given aspect ratio and free layer (or region) thickness the activation energy being dependent on the free layer (or region) volume scales down by $w^2$, where w is the width of the magnetic cell. Otherwise, the switching fields increase roughly by $1/\sqrt{w}$. Thus, when scaling down MRAM cells, field selected switching becomes ever harder, but at the same time the magnetic cell loses its information more and more rapidly due to thermal activation. For instance, a major problem with having a small activation energy (energy barrier) is that it becomes extremely difficult to selectively switch one MRAM cell in an array, where selectability is seen to allow switching without inadvertently switching other MRAM cells. Further, a rather strong coupling of the antiferromagnetically coupled layers is required to reduce dipole coupling.

In order to solve the above problems, it has been proposed to add another ferromagnetic layer to the stack of MTJ layers to provide for a static magnetic offset field that shifts rectangular astroid in the stability diagram of FIG. 1 in such a way that the toggling point T approaches the origin of coordinates representing a zero magnetic field of both bit and word lines.

Figure 2:
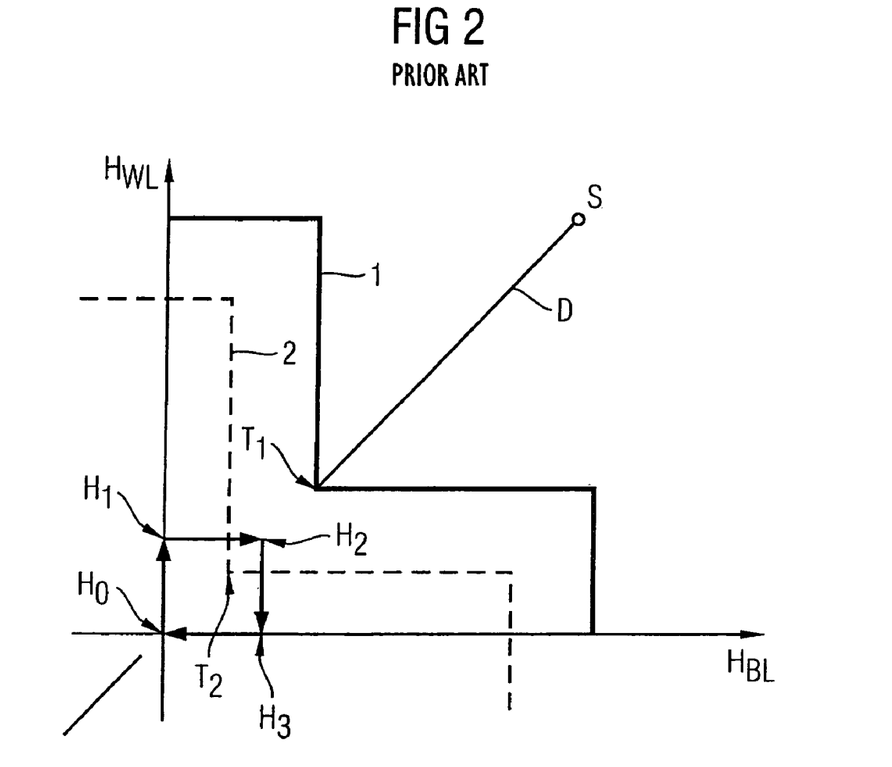
FIG. 2 depicts a stability diagram of FIG. 1 illustrating shifting the toggling point towards the origin of coordinates by application of a static magnetic offset field.

Reference is now made to FIG. 2, where the effect of an additional static magnetic offset field is illustrated. As can be seen, providing a further magnetic offset field results in a shift of rectangular astroid 1 (solid line) to rectangular astroid 2 (dotted line), and, hence, toggling point $T_1$ is shifted to toggling point $T_2$, which is closer to the diagram axes crossing point. Accordingly, circling around toggling point $T_2$ for switching of the memory cell can be effected by reduced magnetic switching fields $H_0$, $H_1$, $H_2$, $H_3$ as compared to the case without application of a static magnetic offset field as shown in FIG. 1.

However, adding of a ferromagnetic offset layer, which creates a static magnetic offset field for shifting the toggling point has the drawback that such additional ferromagnetic layer reduces permanently the activation energy for switching of the MRAM cell. Aggravating this problem, this effect adds to the activation energy reduction the MRAM cell is already suffering due to its down-scaling. For that reason, inadvertent switching of MRAM cells due to thermal fluctuations is more likely to occur, which for adiabatic rotational switching is most critical in the idle state, that is to say in the state where the chip stands-by without being operated (in contrast to Stoner-Wohlfahrt-switching of convenient MRAM cells, where the most critical events are the half-select events).

SUMMARY

In light of the above, it is an object of the invention to provide a magnetoresistive memory cell allowing a cell size down-scale without thereby causing severe problems as to an increase of switching-fields and decrease of activation energy.

It is another object of the invention to provide a method of switching the above memory cell and a method of writing to a memory chip comprising a plurality of such memory cells.

The aforethe objects are achieved individually and/or in combination, and it is not intended that the present invention be construed as requiring two or more of the objects to be combined unless expressly required by the claims attached hereto.

According to a first aspect of the invention, a magnetoresistive memory cell comprises a magnetic tunnel junction and first and second current lines, which are typically and preferably crossing at right angles, while each magnetoresistive memory element typically is positioned at an intersection thereof. It, however, is not essential that the memory cell is placed at an intersection thereof, it rather is sufficient that the magnetic tunnel junction is at least magnetically coupled to the first and second current lines. The magnetoresistive tunnel junction (MTJ) includes first and a second magnetic regions made of magnetic material stacked in parallel, overlying relationship and separated by a layer of nonmagnetic material, that is to say, arranged on both sides thereof. The second magnetic region is provided with a magnetically fixed (pinned) magnetization or magnetic moment vector, while the first magnetic region is provided with a "free" magnetization or magnetic moment vector, which is free to be switched between the same and opposite directions with respect to the fixed magnetization direction of the second magnetic region. Both magnetic regions are magnetically anisotropic having their magnetic anisotropy axes preferably aligned in a parallel configuration. The free magnetic moment vector of the first magnetic region is magnetically coupled to the first and second current lines for its switching between two directions aligned with the magnetic anistropy axis of the free magnetic region.

In the magnetoresistive memory cell of the invention, the free magnetic region is comprised of at least two ferromagnetic layers being antiferromagnetically coupled, where a tri-layered structure including two ferromagnetic layers being antiferromagnetically coupled by an intermediate layer made of antiferromagnetic coupling material is preferred.

According to the invention, the memory cell further comprises a switchable ferromagnetic offset field layer (FMO) which is provided with a free magnetic moment vector, at least in case an external magnetic field is applied thereto, comprising at least a vector component which is aligned with magnetic anisotropy axis of the first or second magnetic regions. For this purpose, the switchable ferromagnetic offset field layer may be provided with magnetic anisotropy the axis of which is preferably aligned with the magnetic anisotropy axis of the first or second magnetic regions. Magnetic anisotropy of the free magnetic offset field layer may be due to shape anisotropy and/or intrinsic anisotropy. In the former case, the free magnetic offset field layer may, for instance, be elliptic in shape.

The free magnetic moment vector of the switchable ferromagnetic offset field layer or at least a vector component thereof can be switched between the same and opposite directions with respect to the fixed magnetic moment vector of the first magnetic region. Switching of the magnetic moment vector of the FMO in a certain direction depending on the actual configuration of the memory cell, i.e. arrangement of the FMO relative to the free magnetic region and current lines and quadrant used for adiabatic rotational switching, includes a preferable and advantageous shift of the toggling point T in a direction toward the origin of coordinates of a stability diagram representing magnetic fields of first and second current lines to which the memory cell is magnetically coupled to This switching can be accompanied by a reduction of magnetic fields for switching the memory cell (which state of the memory cell is called "active state" of the memory cell). Otherwise, a preferable and advantageous shift of the toggling point T in a direction away from the origin of coordinates of the stability diagram can be achieved in the case where the magnetic moment vector of the switchable ferromagnetic offset field layer is switched into its opposite direction which is accompanied by an enlargement of magnetic fields and activation energy for switching the memory cell (which state of the memory cell is called "passive state" of the memory cell).

Hence, it becomes possible to switch the memory cell into its active state ("activate" the memory cell) before the memory cell is to be switched between its logic states (i.e. different alignments of the free magnetic moment vector of the second magnetic region with respect to the fixed magnetic moment vector of the first magnetic region), and to switch the memory cell into its passive state ("passivate" the memory cell) after the memory cell has been switched between its logic states. Accordingly, depending on the orientation of the magnetic moment vector of the FMO with respect to the fixed magnetic moment vector of the magnetic reference region favouring or disfavouring of switching of memory cells between their logic states is achieved, and, as a particular advantage, passive memory cells are practically immune against inadvertent switching by magnetic stray fields arriving from neighbouring memory cells as is likely to occur in the convenient case. Hence, with increased activation energy there is less of a risk for unintended magnetization reversal in the storage case. In order to avoid any inadvertent switching of the memory cell between its logic states, the switching fields for switching the FMO has to be sufficiently small to not arrive in the saturation region of the memory cell in its active state. In order to avoid any inadvertent switching of the FMO, the minimal switching field of the FMO has to be larger than the toggling field used for switching the cells.

According to a preferred embodiment of the invention, the switchable ferromagnetic offset field layer is magnetically coupled to the first and second current lines for its switching, and, preferably, Stoner-Wohlfahrt-switching is used for its switching. For that purpose, the switchable ferromagnetic offset field layer may be arranged adjacent one of the first and second current lines or may be in contact therewith. It also is possible that the switchable ferromagnetic offset field layer is realized as an additional stacking layer of the stacked magnetic tunnel junction.

According to a further aspect of the invention, a method of switching a magnetoresistive memory cell based on adiabatic rotational switching (as described above) is provided, which comprises: providing a magnetoresistive memory cell in accordance with the invention and as described above, and switching the free magnetic moment vector of the switchable ferromagnetic offset field layer in a preferred direction at a time $t_0$ such that a switching field of the free magnetic moment vector of the free magnetic region is reduced. This is achieved by switching the free magnetic moment vector of the switchable ferromagnetic offset field layer in a direction parallel or antiparallel to the fixed magnetic moment vector of the first magnetic region. Upon doing so, the memory cell is brought into its active state having reduced field switching currents.

Then, a first current pulse to one of the first and second current lines is applied at a time $t_1$, and additionally a second current pulse is applied to the other one of the first and second current lines at a time $t_2$, followed by turning off the first current pulse at a time $t_3$ and turning off the second current pulse at a time $t_4$, in which a timed pulse sequence $t_0<t_1<t_2<t_3<t_4$ is fulfilled. As a result, the free magnetic moment vector of the free (second) magnetic region at a time $t_4$ is oriented different from the initial preferred direction at the time $t_0$.

Afterward, the free magnetic moment vector of the switchable ferromagnetic offset field layer is switched at a time $t_5$, wherein $t_4<t_5$, in another preferred direction different from the initial preferred direction at a time $t_0$, such that a switching field of the free magnetic moment vector of the free magnetic region is enlarged. Upon doing so, the memory cell is brought into its passive state having enlarged field switching currents.

In the above method of switching the memory cell it is preferred that switching of the switchable ferromagnetic offset field layer, that is to say activating and passivating of the memory cell, is effected using well-known Stoner-Wohlfahrt-switching. It is more preferable that switching of the free magnetic moment vector of the switchable ferromagnetic offset field layer is achieved by applying a current pulse to one of the first and second current lines alone, which is possible without any problems, for instance, in case the astroid in the stability diagram of the switchable ferromagnetic offset field layer is rotated by an angle of 45° with respect to the rectangular astroid of the free magnetic region. There is no selectivity problem and a whole current line that is to be written can be activated at once. It further is desirable in terms of signal margin to switch from the active state into the passive state of the memory cell using a magnetic field in opposite direction to what is used for toggle switching of the memory cell, as in this case the switching boundary to the saturated state is further away. Whether a field in the same direction or in the opposite direction with respect to the fixed magnetic moment vector of the first magnetic region switches from the active state into the passive state depends on the actual configuration of the memory cell (as explained above).

For adiabatic rotational switching the idle state of a memory chip is the most critical state in view of inadvertent switching resulting from a decrease of the activation energy. Therefore, no significant disadvantage may be seen in that activation energy is lowered by activating the memory cell. This is in contrast to Stoner-Wohlfahrt-switching, where the half select events are seen to be most critical in light of the above considerations.

According to yet another aspect of the invention, a method of writing to a magnetic random access memory chip is provided using a plurality of magnetoresistive memory cells according to the invention as described above and also a method of switching magnetoresistive memory cells according to the invention as described above. It is preferred to activate only those memory cells of the memory chip which are to be written. Alternatively, it may be preferred to activate all memory cells whether they are to be written or not in case the chip is turned on. In any case all memory cells are passivated before turning the chip off (idle state).

The above and still further objects, features and advantages of the present invention will become apparent upon consideration of the following detailed description of specific embodiments thereof.

DETAILED DESCRIPTION

An embodiment of the present invention will be described in detail below with reference to the accompanying drawings, where like designations denote like elements.

Figure 3A:
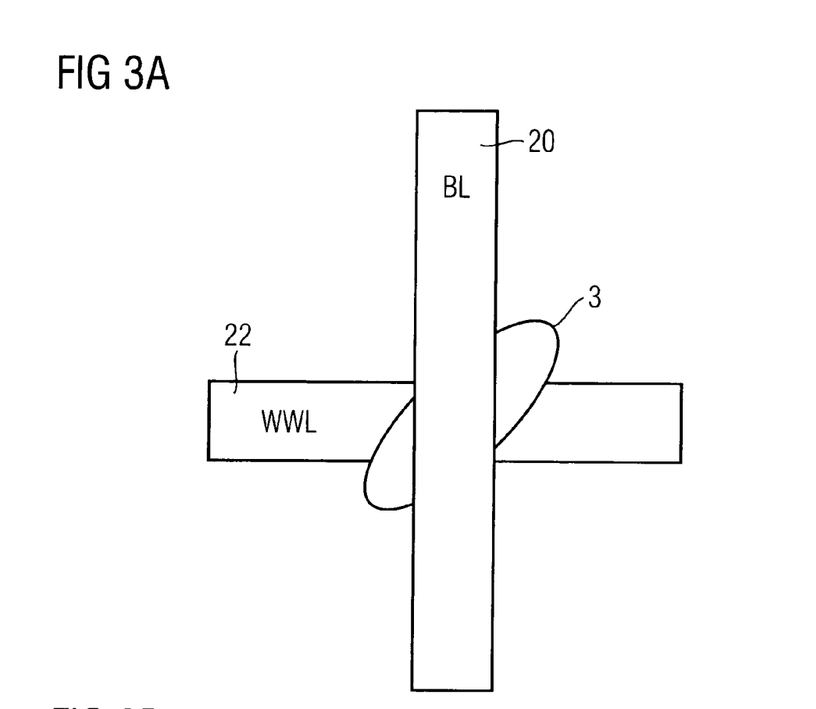
FIGS. 3A and 3B depict an exemplary embodiment of a magnetoresistive memory cell of the invention.
Figure 3B:
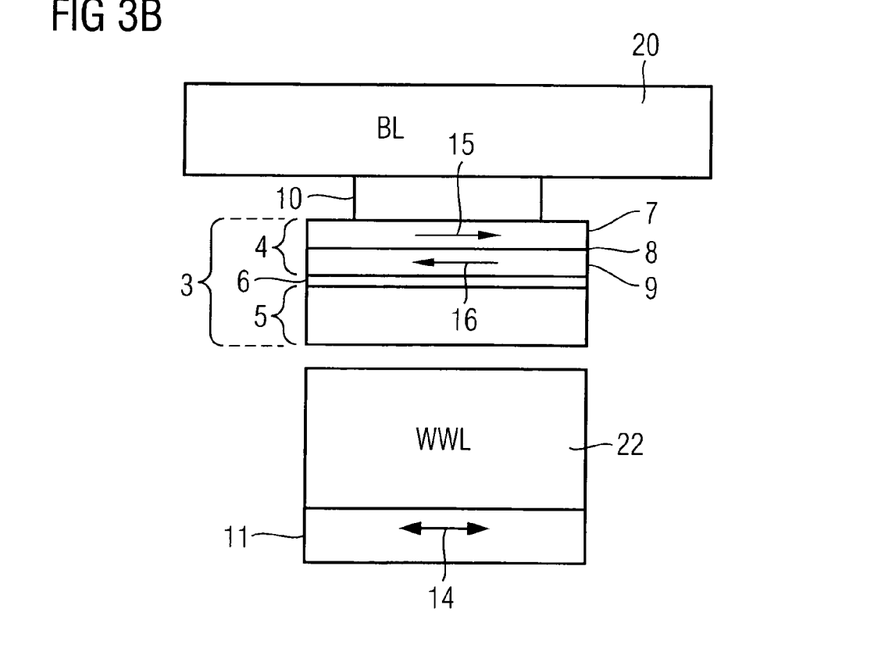

An exemplary embodiment of a memory cell of the invention is described in FIGS. 3A and 3B, where FIG. 3A is a schematic top-down view of a magnetoresisive memory cell of the invention, and FIG. 3B is a schematic sectional view of the memory cell of FIG. 3A.

Based on a conventional magnetic memory cell with first and second current lines along (write) word lines (WWL) and bit lines (BL), respectively, the magnetic memory cell of the invention includes a magnetic tunnel junction (MTJ) 3 illustrated by its easy axis in FIG. 3A, which includes a magnetic free region 4 and a magnetic reference region 5 made of magnetic materials stacked in parallel, overlying relationship and separated by a layer 6 of nonmagnetic material. The (net) magnetic moment vector of the magnetic free region 4 is magnetically coupled to a first current line identified as bit line (BL) 20 above the MTJ 3 and a second current line identified as write word line (WWL) 22 below the MTJ 3 for its switching in a parallel or an antiparallel state with respect to the magnetic moment vector (magnetization) of the reference region 5. Easy axis of the MTJ 3 is inclined at an angle of 45° with respect to both bit and word lines. Magnetic anisotropy axes of both magnetic free region 4 and magnetic reference region 5 are in parallel configuration resulting in a common easy axis of MTJ 3.

Magnetic free region 4 is a tri-layered structure comprised of two ferromagnetic layers 7, 9 having free magnetic moment vectors 15, 16 which are effectively antiferromagnetically coupled by their stray fields and/or an intermediate layer 8 which may be made of (anti-)ferromagnetic coupling material. Free magnetic moment vectors 15, 16 may be balanced or imbalanced. In the former case, a net magnetic moment vector arises in case an external magnetic field is applied. Magnetic free region 4 is also conductively connected to the bit line 20 via contact 10. In FIG. 3B magnetic reference region 5 is shown as a single layer for the purpose of simplicity only, however, those skilled in the art understand that reference region 5 may be comprised of several layers to achieve a pinned (fixed) magnetic moment vector.

According to the invention, a switchable ferromagnetic offset field layer (FMO) 11 made of ferromagnetic material is provided below the write word line (WWL) 22 and in contact therewith. Magnetic anisotropy axis (magnetization) or magnetic moment vector of the FMO 11 is in parallel alignment with the easy axis of the MTJ 3, that is to say, is inclined under an angle of 45° with respect to both write word and bit lines.

In FIGS. 3A and 3B, WWL 22 and BL 20 are crossing at a right angle, while the MTJ 3 is positioned at the intersection thereof. Both current lines generate magnetic fields in case a current is sent therethrough and mutually act on the easy axis magnetization of the MTJ 3 for its switching. For switching the free magnetic moment of the magnetic free region 4 adiabatic rotational switching is used. Alternatively, Stoner-Wohlfahrt-switching is used for switching the free magnetic moment vector of the FMO 11, for which purpose the FMO 11 is magnetically coupled to both write word and bit lines. Switching the FMO 11 it is preferred to use the magnetic field of the write word line alone.

Figure 4:
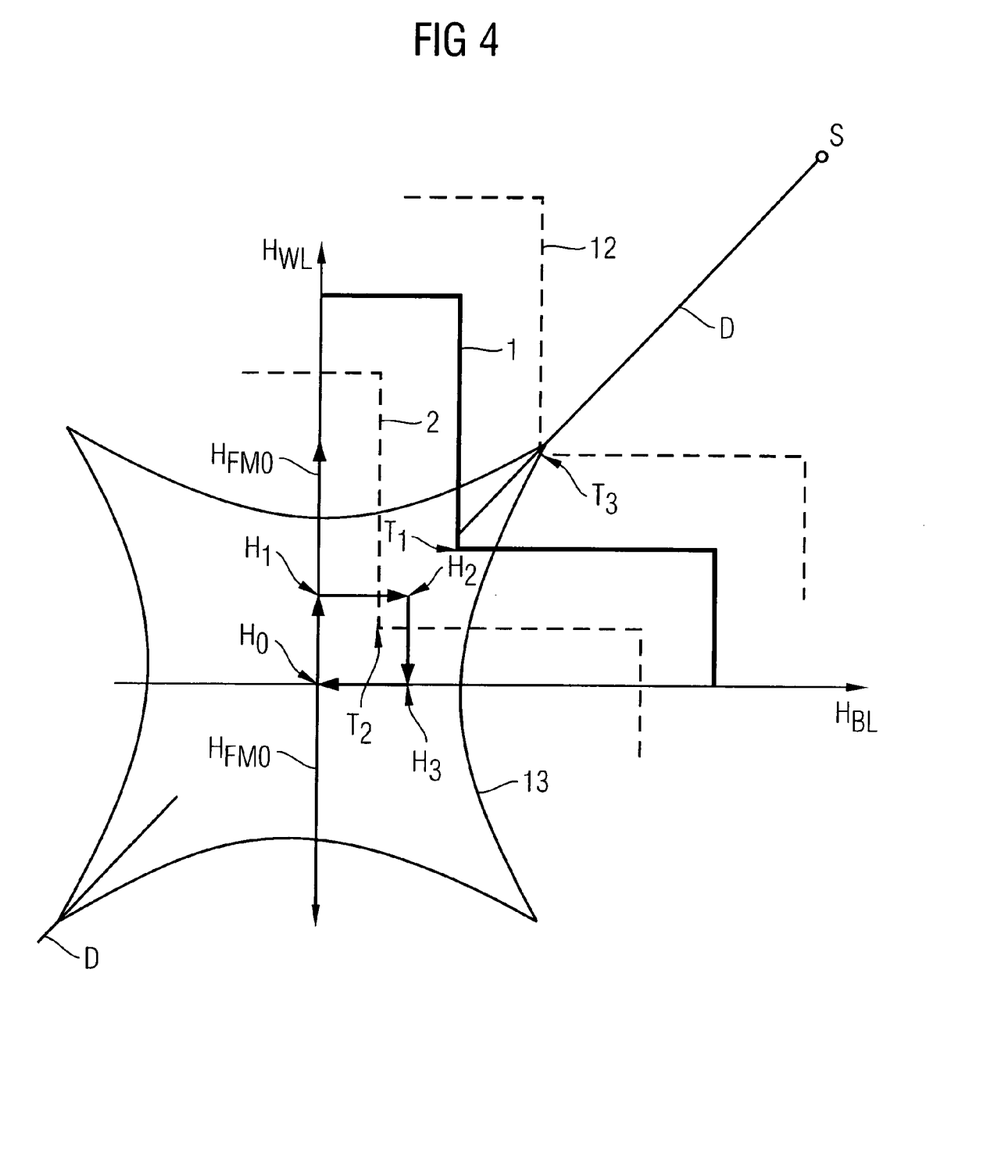
FIG. 4 depicts an exemplary stability diagram of the memory cell of FIGS. 3A and 3B, illustrating shifting of the toggling point in the active and passive states of the memory cell.

Referring to FIG. 4, an exemplary stability diagram of the memory cell of FIGS. 3A and 3B is depicted, in which shifting of the toggling point T into the active and passive states of the memory cell is illustrated.

Starting from a typical rectangular astroid 1 having toggling point $T_1$ without applying any magnetic offset field, free magnetic moment vector of FMO 11 can be switched into one of its orientations along the easy axis of FMO 11 depending on the actual configuration of the memory cell, so that rectangular astroid 1 is shifted to rectangular astroid 2 having its toggling point $T_2$ more closely to the origin of coordinates of the stability diagram than rectangular astroid 1 without magnetic offset field, which results in the active state of the memory cell with reduced switching field currents for circling around toggling point $T_2$ for switching the memory cell. Alternatively, free magnetic moment vector of FMO 11 may be switched into the other one of its orientations along the easy axis of FMO 11 so that rectangular astroid 2 is shifted to rectangular astroid 12 having its toggling point $T_3$ more distanced from the origin of coordinates of the stability diagram than rectangular astroid 1 without magnetic offset field, which results in the passive state of the memory cell with enlarged magnetic switching fields and enlarged activation energy for switching the memory cell.

For switching of the free magnetic moment vector 14 of FMO 11, using Stoner-Wohlfahrt-switching, the magnetic field coupled thereo has to be larger than magnetic field values identified by astroid curve 13, provided that the magnetic field does not reach the magnetic saturation field which can break antiferromagnetic coupling of ferromagnetic layers 7, 9. Otherwise, in order to avoid any inadvertent switching of the free magnetic moment vector of the magnetic free region 4, that is to say, switching of logic states of the memory cell during switching of free magnetic moment vector 14 of FMO 11, magnetic switching fields for switching of FMO 11 are chosen to be sufficiently small, i.e. to be below the saturation field of rectangular astroid 2 of the memory cell in case the memory cell is in its active state. It may be preferred that values of switching fields for switching of FMO 11 are chosen to be above values given by astroid 13 which in turn should be above the toggling field given by rectanglular astroid 2 of the memory cell in its active state. It also is preferred that WWL 22 alone is used for switching of the free magnetic moment vector 14 of FMO 11. FIG. 4 shows magnetic fields of WWL 22 for switching of FMO 111 having values of $H_{FMO}$ and $-H_{FMO}$, respectively.

As can be seen from the foregoing, according to the invention, in the new concept particularly useful for scaling-down of magnetoresistive memory cells, on the one hand, a magnetic offset field for reducing magnetic switching fields of the memory cell can be applied before switching the memory cell, and, on the other hand, a magnetic offset field being oppositely directed as compared to the former case for enlarging magnetic switching fields and activation energy for switching the memory cell can be applied in case the memory cell shall not be switched. Application of the magnetic offset fields is simply effected using magnetic stray fields of a switchable ferromagnetic offset field layer. The memory cell thus can be brought into an active state favoring writing to it, and alternatively into a passive state disfavoring writing to it and favoring keeping the logic information stored therein. In its passive state, the memory cell is practically immune against any inadvertent switching caused by magnetic stray fields of neighbouring memory cells.

Having described the above invention, variations and changes will be suggested to those skilled in the art in view of the teachings set forth herein. It is therefore to be understood that all such variations, modifications and changes are believed to fall within the scope of the present invention as defined by the appended claims.

REFERENCE LIST

1 Rectangular asteroid without magnetic offset field
2 Rectangular asteroid with magnetic offset field
3 Magnetic tunnel junction
4 Magnetic free region
5 Magnetic reference region
6 Tunneling layer
7 Ferromagnetic layer
8 Antiferromagnetic coupling layer
9 Ferromagnetic layer
10 Electric contact
11 Switchable ferromagnetic offset field layer (FMO)
12 Rectangular asteroid with magnetic offset field
13 Asteroid of FMO
14 Free magnetic moment of FMO
15 Free magnetic moment of ferromagnetic layer
16 Free magnetic moment of ferromagnetic layer
20 Bit line
22 Write word line

What is claimed is:

1. A magnetoresistive memory cell comprising:
a magnetic tunnel junction comprising first and second stacked magnetic regions including magnetic material with a magnetic anisotropy in parallel alignment, wherein the first and second stacked magnetic regions being separated by a layer of non-magnetic material, the first magnetic region being positioned on one side of the layer of non-magnetic material and being provided with a fixed magnetic moment vector, the second magnetic region comprising at least two ferromagnetic layers being antiferromagnetically coupled and positioned on the other side of the layer of non-magnetic material, and the second magnetic region further including a free magnetic moment vector that is freely switchable between the same and opposite directions with respect to the fixed magnetic moment vector of the first magnetic region, the free magnetic moment vector being magnetically coupled to magnetic fields of first and second current lines to facilitate switching of the free magnetic moment vector; and
a switchable ferromagnetic offset field layer including a free magnetic moment vector comprising at least a vector component aligned with the magnetic anisotropy of the first and second magnetic regions and being freely switchable between the same and opposite directions with respect to the fixed magnetic moment vector of the first magnetic region.

2. The magnetoresistive memory cell of claim 1, wherein the second magnetic region comprises a tri-layered structure including two ferromagnetic layers being antiferromagnetically coupled by an intermediate layer made of antiferromagnetic coupling material.

3. The magnetoresistive memory cell of claim 1, wherein the magnetic anisotropy of the first and second magnetic regions is inclined at an angle of about 45° with respect to the first and second current lines.

4. The magnetoresistive memory cell of claim 1, wherein the free magnetic moment vector of the switchable ferromagnetic offset layer is aligned with the magnetic anisotropy of the first and second magnetic regions.

5. The magnetoresistive memory cell of claim 1, wherein magnetic anistropy of the switchable ferromagnetic offset field layer is due to intrinsic magnetic anisotropy.

6. The magnetoresistive memory cell of claim 1, wherein magnetic anistropy of the switchable ferromagnetic offset field layer is due to magnetic shape anisotropy.

7. The magnetoresistive memory cell of claim 6, wherein the switchable ferromagnetic offset field layer is elliptic in shape.

8. The magnetoresistive memory cell of claim 1, wherein the switchable ferromagnetic offset field layer is magnetically coupled to the first and second current lines.

9. The magnetoresistive memory cell of claim 1, wherein the magnetic tunnel junction is disposed between the first and second current lines.

10. The magnetoresistive memory cell of claim 1, wherein the switchable ferromagnetic offset field layer is arranged adjacent one of the first and second current lines.

11. The magnetoresistive memory cell of claim 10, wherein the switchable ferromagnetic offset field layer is positioned to be in contact with one of the first and second current lines.

12. The magnetoresistive memory cell of claim 1, wherein the switchable ferromagnetic offset field layer is stacked within the magnetic tunnel junction.

13. A magnetic random access memory chip comprising a plurality of magnetoresistive memory cells as recited in claim 1.

14. A method of switching a magnetoresistive memory cell comprising:
providing a magnetoresistive memory cell as recited in claim 1;
switching of the free magnetic moment vector of the switchable ferromagnetic offset field layer in a preferred direction at a time $t_0$ such that a switching field of the free magnetic moment vector of the free magnetic region is reduced;
applying a first current pulse to one of the first and second current lines at a time $t_1$;
applying a second current pulse to the other one of the first and second current lines at a time $t_2$;
turning off the first current pulse at a time $t_3$ and turning off the second current pulse at a time $t_4$, wherein $t_0<t_1<t_2<t_3<t_4$, such that the free magnetic moment vector of the free magnetic region at a time $t_4$ is oriented different from the initial preferred direction at the time $t_0$; and
switching of the free magnetic moment vector of the switchable ferromagnetic offset field layer at a time $t_5$, wherein $t_4<t_5$, in another preferred direction different from the initial preferred direction at the time $t_0$, such that a switching field of the free magnetic moment vector of the free magnetic region is enlarged.

15. The method of switching a magnetoresistive memory cell of claim 14, wherein switching of the free magnetic moment vector of the switchable ferromagnetic offset field layer is achieved by Stoner-Wohlfahrt-switching.

16. The method of switching a magnetoresistive memory cell of claim 14, wherein switching of the free magnetic moment vector of the switchable ferromagnetic offset field layer is achieved by applying a current pulse to one of the first and second current lines alone.

17. The method of switching a magnetoresistive memory cell of claim 14, wherein switching of the free magnetic moment vector of the switchable ferromagnetic offset field layer at the time $t_5$ is achieved by applying a magnetic offset field being oppositely directed to magnet fields being applied for switching of the free magnetic moment of the free magnetic region at the times $t_1$ through $t_4$.

18. A method of writing to a magnetic random access memory chip comprising a plurality of magnetoresistive memory cells as recited in claim 1 and utilizing a method of switching each of the magnetoresistive memory cells as recited in claim 14, wherein:
after turning on the chip, the switching of the free magnetic moment vector of the switchable ferromagnetic offset field layer in a preferred direction at a time $t_0$, such that a switching field of the free magnetic moment vector of the free magnetic region is reduced, is achieved for only selected magnetoresistive memory cells that are to be switched; and
before turning off the chip, switching of the free magnetic moment vector of the switchable ferromagnetic offset field layer at a time $t_5$, wherein $t_4<t_5$, in another preferred direction different from the initial preferred direction at the time $t_0$, such that a switching field of the free magnetic moment vector of the free magnetic region is enlarged, is achieved for at least the memory cells that have been switched.

19. A method of writing to a magnetic random access memory chip comprising a plurality of magnetoresistive memory cells as recited in claim 1 and utilizing a method of switching a magnetoresistive memory cell as recited in claim 14, wherein:
after turning on the chip, switching of the free magnetic moment vector of the switchable ferromagnetic offset field layer in a preferred direction at a time $t_0$, such that a switching field of the free magnetic moment vector of the free magnetic region is reduced, is achieved for all the magnetoresistive memory cells; and
before turning off the chip, switching of the free magnetic moment vector of the switchable ferromagnetic offset field layer at a time $t_5$, wherein $t_4<t_5$, in another preferred direction different from the initial preferred direction at the time $t_0$, such that a switching field of the free magnetic moment vector of the free magnetic region is enlarged, is achieved for all the memory cells.

* * * * *